US006258228B1

(12) United States Patent
Reiss

(10) Patent No.: US 6,258,228 B1
(45) Date of Patent: *Jul. 10, 2001

(54) WAFER HOLDER AND CLAMPING RING THEREFOR FOR USE IN A DEPOSITION CHAMBER

(75) Inventor: Ira Reiss, New City, NY (US)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,911

(22) Filed: Jan. 8, 1999

(51) Int. Cl.[7] ............................ C23C 14/34; C23C 16/00; B05C 13/00
(52) U.S. Cl. ...................... 204/298.15; 118/503; 118/728
(58) Field of Search .................................. 118/500, 503, 118/728; 204/298.15, 192.25; 156/345

(56) References Cited

U.S. PATENT DOCUMENTS

| | | | |
|---|---|---|---|
| 3,641,402 | * 2/1972 | Revitz et al. | 204/192.25 |
| 4,311,427 | 1/1982 | Coad et al. | 414/217 |
| 4,860,439 | 8/1989 | Riley | 29/741 |
| 4,915,564 | 4/1990 | Eror et al. | 204/298.25 |
| 4,997,677 | 3/1991 | Wang et al. | 118/724 |
| 5,372,612 | * 12/1994 | Cronin et al. | 414/225 |
| 5,391,275 | * 2/1995 | Mintz | 204/298.11 |
| 5,681,764 | * 10/1997 | Hess et al. | 438/21 |
| 5,730,803 | 3/1998 | Steger et al. | 118/724 |
| 5,820,329 | * 10/1998 | Derbinski et al. | 414/225 |
| 6,143,147 | * 11/2000 | Jelinek | 204/298.15 |

FOREIGN PATENT DOCUMENTS

| | | |
|---|---|---|
| 0498752 | 8/1992 | (EP) . |
| 0725426 | 8/1996 | (EP) . |
| 60054444 | 3/1985 | (JP) . |

* cited by examiner

*Primary Examiner*—Nam Nguyen
*Assistant Examiner*—Gregg Cantelmo
(74) *Attorney, Agent, or Firm*—Wood, Herron & Evans, L.L.P.

(57) ABSTRACT

Warping of a clamping ring, by which a series of semiconductor wafers is held to a wafer holder for vapor deposition of coatings onto the wafers, is retarded by providing a clamping ring formed of the material having a coefficient of thermal expansion that is approximately the same as or close to that of the coating material being deposited onto the wafers. Preferably also, the material of which the ring is formed has a high modulus of elasticity, high thermal conductivity and a high yield strength. For the deposition of tantalum and gold, which is useful for providing backside thermal conductivity on semiconductor wafers, a clamping ring of molybdenum is preferred. The onset of excessive warping is delayed by replacing clamping rings with clamping rings formed of a material having a thermal expansion coefficient closer to that of the material to be deposited, and preferably having the other preferred properties. Preferably, the clamping ring is one having a generally circular opening that is slightly smaller than the wafers to be clamped and that has a flat edge on the inner edge of the ring corresponding to the orientation flat found on the outer edge of an industry standard wafer, so that the ring engages the wafer during clamping around the entire outer rim of the wafer. A ring having a small number of discrete mounting points for spring attachment to the holder, and having a set of latches connected thereto, is preferred.

12 Claims, 6 Drawing Sheets

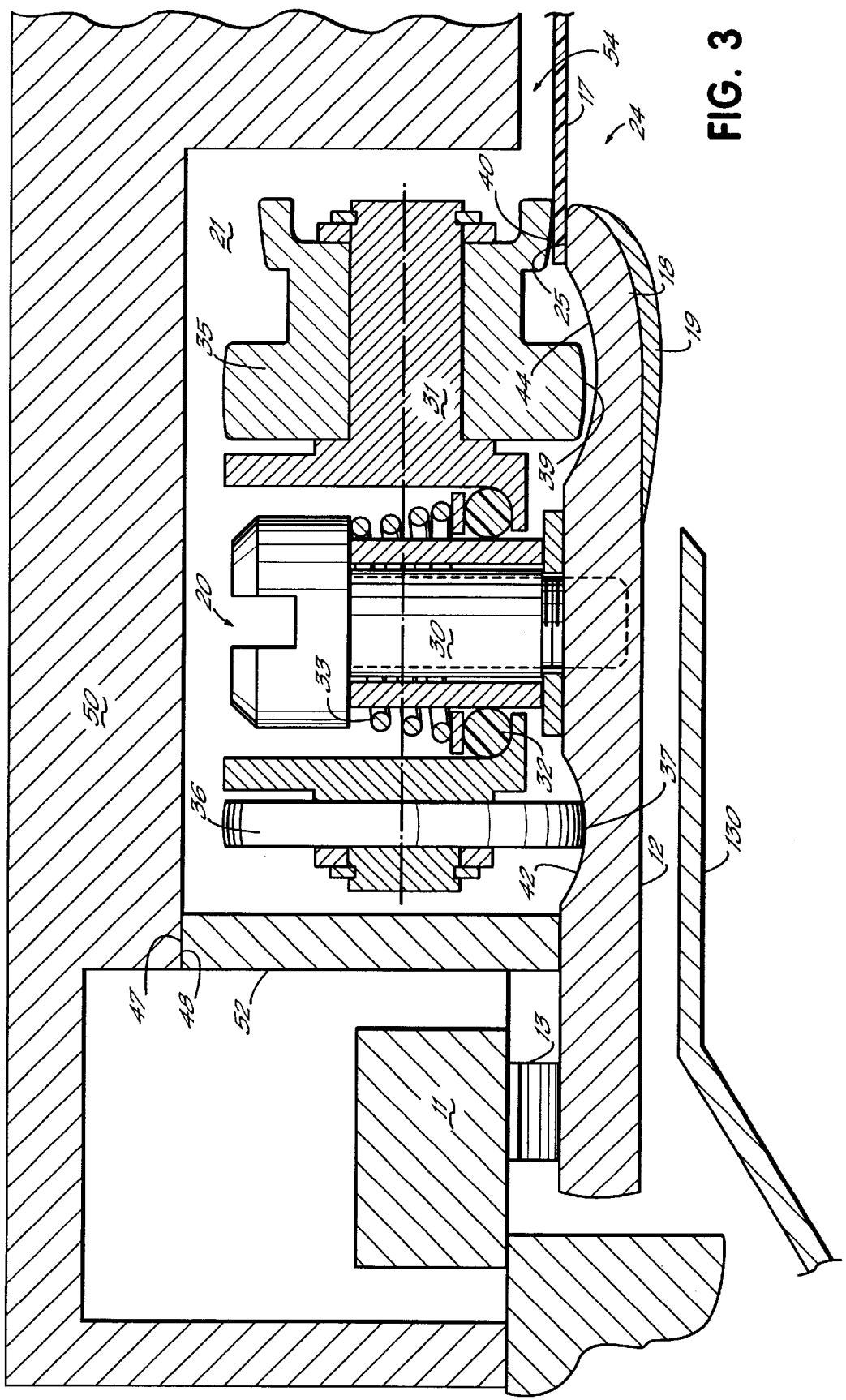

US 6,258,228 B1

WAFER HOLDER AND CLAMPING RING THEREFOR FOR USE IN A DEPOSITION CHAMBER

This invention relates to the processing of wafers, particularly semiconductor wafers by the vapor deposition thereon of films under high vacuum. The invention particularly relates to the solution of the problem of the warping of wafer clamping components, particularly wafer holder clamping rings, in the course of the processing of such wafers.

BACKGROUND OF THE INVENTION

In semiconductor manufacturing processes such as, for example, the sputtering of thin films onto substrates such as those formed of silicon it is necessary to hold substrate wafers in place for processing. While held, a sequence of processes is performed on the wafer, many of which result in the application of a thin film or coating layer to the wafer. Wafers held for the application of such coatings may be held in a horizontal orientation, facing upwardly or downwardly, or may be held in a vertical orientation facing in a horizontal direction. In all such coating processes, the wafer to be coated must be retained securely to a holder in a generally stress free state. To hold the wafers in such a state and to move the wafers safely and quickly between various processors and positions, wafer holders or clamps that employ resiliently supported continuous clamping rings to urge the wafer uniformly around its edge against the wafer holder have gained wide acceptance.

Wafer holders that employ wafer clamping rings are exposed to a range of temperatures when holding a wafer in a vacuum chamber for processing. These rings are further exposed to deposition of the same materials that are being deposited onto the wafers. While each wafer is subjected to a single cycle in a processing chamber in which the temperatures may rise and fall, and where a film thickness measured in microns is deposited on the wafer, the holders, and particularly the clamping rings that urge the wafers against the holders, are exposed to a large number of cycles in each of which the temperatures are cycled from maximum to minimum and in the course of which multiple layers of coating material accumulate on the clamping ring surfaces.

Over the course of many cycles, the clamping rings are observed to warp. The warping of a clamping ring is typically a permanent deformation of the clamping ring that alters the way in which the ring contacts the wafer. When the warping becomes excessive, the ring no longer adequately clamps the wafer. As a result, wafers can move in the holder, can be unevenly subjected to clamping forces in the holder causing breakage, or are not held in the proper position. The amount of warping and the number of cycles that it takes to cause excessive warping is observed to vary with different coating materials and coating processes. When the warping becomes excessive, after a number of wafers have been processed, it is necessary to replace the clamping ring with a new ring having its original design shape that will clamp the wafer uniformly around its edge.

For example, in one processing sequence in which the backside of a semiconductor is coated with two deposition layers of tantalum (Ta) and one layer of gold (Au), it is found that after only several hundred wafers are processed, excessive warping of the inner diameter of the clamping ring occurs lifting the inner rim out of its normal plane and toward the deposition chamber. As a result, a chamber overhaul to replace the clamping ring is required after far fewer wafers are processed than the several thousand desired.

Replacement of the clamping ring is necessary to prevent damage to the wafers and results in a loss of expensive production time in the making of semiconductors. The warping problem has not been effectively solved.

Accordingly, there remains a need to prevent or substantially delay the onset of excessive clamp ring warping in semiconductor wafer holders used in film deposition processes.

SUMMARY OF THE INVENTION

A primary objective of the present invention is to provide a clamping ring for clamping a semiconductor wafer to a wafer holder during the deposition of film onto the wafer that will resist warping over the course of processing a large number of wafers. A particular objective of the invention is to provide a wafer clamping ring that can accumulate deposited film of substantial thickness without warping to the point that cleaning or replacement of the ring is required. A further objective of the present invention is to provide a wafer mounting ring that will return to its original geometry after being cleaned of deposits that have built up to the degree that requires the cleaning of the ring.

Another objective of the present invention is to provide a method and apparatus by which coatings of material, for example materials such as tantalum and gold, can be deposited on a large number of wafers sequentially held by a wafer holder that employs a wafer clamping ring in processes where the deposition process subjects the ring and deposits to wide temperature variation cycles. A particular objective of the invention is to provide such a method and apparatus in systems where the clamping ring is supported on minimal mounting points providing limited or local conduction of heat from the ring, particularly where the process is carried out in a vacuum where heat dissipation by convection is substantially absent.

According to the principles of the present invention, a clamping ring is formed of a material having a coefficient of thermal expansion that is approximately equal to that of the material being deposited. By "substantially equal" is meant that the coefficient of thermal expansion of the material of which the clamping ring is made is closer to the coefficient of thermal expansion of the coating material than are the coefficients of thermal expansion of alternative materials, Preferably the coefficient of thermal expansion of the material of which the clamping ring is made also has a high modulus of elasticity so that it distorts less when subjected to a given thermal stress. In addition, it is preferable that the material of which the ring is made also have a high coefficient of thermal conductivity so that temperature gradients, and thus thermal stresses, are lower. It is also preferable that the material of which the ring is made have a high yield stress at the temperatures to which the ring is to be subjected during the deposition processes performed on wafers while held by the ring so that the ring can withstand higher thermal stress before undergoing permanent or plastic deformation.

In accordance with the preferred embodiment of the invention, a clamping ring is provided that is formed essentially of molybdenum metal. The clamping ring is configured as an annular disc with a substantially circular opening at its center that is bounded by a continues edge that engages the entire rim of a semiconductor wafer being held in a holder for the vapor deposition of film onto the wafer. The inner edge of the opening of the annular disc is circular for most of its circumference, that is, for all of the circumference of the disc except for a cord section configured to conform to the flat orientation edge of a conventional semiconductor wafer. The inner diameter of the disc is preferably about five centimeters less than the outside diameter of the wafers being clamped.

Further in accordance with the preferred embodiment of the invention, a clamping ring is provided which has mounting points spaced around the disc that provide for a balanced resilient mounting of the disc to the housing of a wafer holder and presents a substantially limited portion of the disc in contact with cooler structure to which heat could flow. The ring preferably includes six spring mounting points spaced around the disc which connect to springs on which the disc is mounted. The disc preferably also supports a set of latches, preferably three in number, by which a wafer is latched to the clamping ring.

Preferably, a clamping ring for the deposition of a film of tantalum and gold onto wafers is provided that is formed essentially of molybdenum. Clamping rings of other materials having coefficients of thermal expansion that match that of the film being deposited may also be used with a Ta-Ta-Au film or with other film compositions. Generally, a high modulus of elasticity, high thermal conductivity and high yield strength are also preferred, and for most coating processes, non-magnetic material is also desirable.

With the method and clamping ring of the present invention, the number of wafers coated with a Ta-Ta-Au film, as compared to rings made of conventional materials such as stainless steel, is increased by a factor of 5 or 10 or more between overhauls of the chamber that are required to clean or replace the clamping ring due to excessive warping of the ring. Further, rings made according to the present invention will, when cleaned of the deposits after being removed due to excessive warping, return to their original flat geometries, while rings made of conventional materials such as stainless steel are found to develop a permanent deformation rendering them useless after warping, even if cleaned of the deposits.

These and other objectives of the present invention will be more readily apparent from the following detailed description of the invention.

BRIEF DESCRIPTION OF THE DRAWINGS

FIG. 3 is a cross-sectional view, taken along line 3—3 of FIG. 1, of a latch assembly of the wafer holder of FIGS. 1 and 2 in an arrangement particularly useful for wafer backside processing.

DETAILED DESCRIPTION OF THE PREFERRED EMBODIMENT

One form of wafer holder for use in physical vapor deposition systems is described in the commonly assigned and copending U.S. patent application entitled Wafer Processing Apparatus with Low Particle Generating Wafer Clamp, Ser. No. 09/183,503, filed Oct. 30, 1998, now U.S. Pat. No. 6,143,147, and hereby expressly incorporated by reference herein. An example of such a wafer holder is the wafer holder 10 illustrated in FIGS. 1–3.

Figure 1:
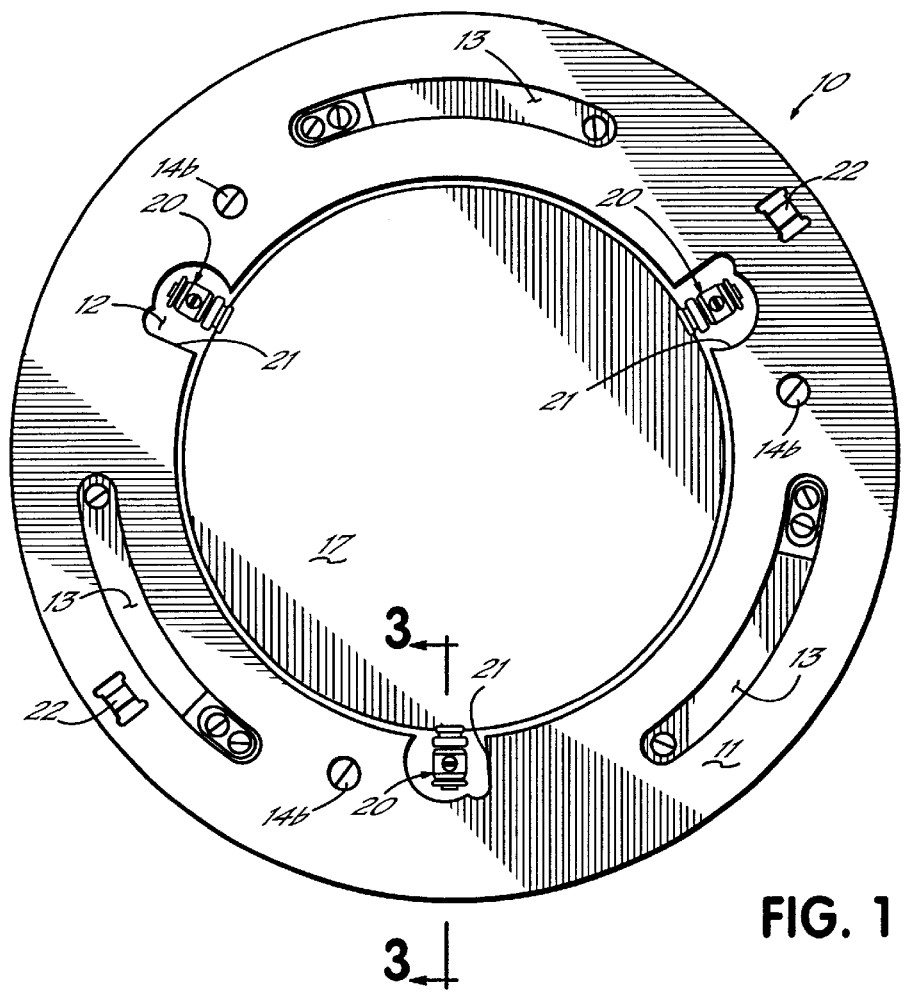
FIG. 1 is a backside view of a wafer holder of a semiconductor wafer processing apparatus for application of the principles of the present invention.

FIG. 1 illustrates wafer holder 10 holding a semiconductor wafer 17 and viewed from the side of the wafer 17 that is opposite the surface of the wafer 17 that is to be processed. The holder 10 includes an annular housing 11 to which a wafer mounting ring 12 is resiliently attached by an array of springs that include "a set of three equally angularly spaced leaf springs 13, at holes 13a by screws 13b, and a set of three equally angularly spaced conical coil springs 14, at holes 14a by screws 14b, arranged so that the leaf and coil" springs alternate around the holder 10 and provide a balance mounting force between the ring 12 and the housing 11. The springs 13 and 14 function to uniformly urge the mounting ring 12 toward and against the holder 11.

Rotatably mounted to the mounting ring 11 at equally spaced angular intervals around the holder 10 are three latch assemblies 20. The latch assemblies 20 are configured to rotate through approximately 90° between latched positions, as illustrated in FIG. 1, and unlatched positions in which the latch assemblies 20 are rotated 90° from their orientations illustrated in FIG. 1, as is the latch assembly 20 illustrated in FIG. 2. The latch assemblies 20 are recessed into cutouts 21 in the housing 11.

The three latches are moved in unison between their latched and unlatched positions by a latch actuator mechanism (not shown) such as the mechanisms more particularly described in the copending and commonly assigned U.S. patent application Ser. No. 08/827,690, filed Apr. 10, 1997, now U.S. Pat. No. 5,820,329 hereby expressly incorporated by reference herein, and in U.S. Pat. No. 4,915,564 referred to below in connection with FIGS. 4 and 5.

An example of a wafer handling and holding mechanism for the processing of wafers in a vertical orientation is described and illustrated in commonly assigned U.S. Pat. No. 4,915,564, hereby expressly incorporated by reference herein. In the apparatus of U.S. Pat. No. 4,915,564, individual wafers are gripped on their back surfaces by vacuum chucks on a transfer arm and transferred, device side first, through the door of a loadlock chamber of a processing apparatus. In the apparatus described in U.S. Pat. No. 4,915,564, unlike with the clamping ring 12 described above which bears against the entire edge of the wafer 17, the transfer arm moves the wafer against discrete tabs on a clamping ring carried by the wafer holder positioned in the loadlock of the machine. A plurality of latches, three in number and spaced at even intervals around the periphery of the holder, move behind the wafer to clamp the wafer between the latches and the clamping ring tabs.

In processing apparatus 100, the holder 10 is mounted to a carrier or index plate 103 that rotates to sequentially move each holder 10 among the stations 111–115 of the processing machine 100. The holder 10 is held to the index plate by one fixed pin carried by the plate and two spring-loaded pins 22 carried by the housing 11 of the wafer holder 10, as illustrated in perspective in FIG. 2. The fixed pin of the plate is received by a notch 23 in the housing 11 while the spring loaded pins are received by radial recesses in the edge of an opening of the index plate 103.

The wafer mounting ring 12 has an opening 24 therein that is slightly smaller than a wafer 17 that is to be held the holder 10 for processing, though preferably of the same shape as the wafer. The opening 24 is circular around most of its circumference with a flat side 29 which conforms to the orientation flat edge of an industry standard wafer. Accordingly, the opening 24 is substantially circular. For clamping a 150 mm wafer, the diameter of the opening 24 is approximately 145 mm. The ring 12 has an inner annular surface 25 against which the edge of the wafer 17 rests when it is being held by the holder 10. The housing 11 has an opening 15 in its center that is larger than the wafer 17 that is to be held in the holder 10 for processing. Such a wafer 17 is inserted by a wafer transfer arm to which the wafer 17 is held by a chuck, for example a vacuum chuck, through the opening 15 until its outer edge lies in contact with the surface 25. The movement of the wafer 17 against the surface 25 may move the ring 12 slightly away from the housing 11 against the force exerted by the springs 13 and 14. Preferably, the force exerted by the inner edge of the ring 24 on the outer edge of the wafer 17 is about 12 pounds.

When moved by the actuators to their latched positions, as illustrated in more detail in FIG. 3, the latch assemblies 20 clamp the edge of the wafer 17 against the annular surface 25 around the opening 24 in the wafer holding ring 12. Each latch assembly 20 is pivotally mounted to the ring 12 at a mounting post 30 fixed to the ring 12. The latch assembly 20 includes a non-metallic latch body 31 pivotally mounted on the post 30 through a tungsten carbide ball bearing 32, and is biased against the mounting ring 12 by a conical spring 33 that surrounds the mounting post 30. The latch bodies 31 each have a pair of actuator pin receiving slots therein (not shown), equally spaced from the mounting post 30, to receive actuator pins of the actuator mechanism on a transfer arm (not shown) situated outside of the housing 101 when the holder is being loaded or unloaded at the loadlock 111.

At opposite ends of the latch body 31 are rotatably mounted a pair of non-metallic rollers, including a front roller 35 and a back roller 36, both rotatable about an axis 68 that is parallel to the mounting ring 12 and intersects the centerline of the mounting post 30 approximately at a right angle. The back roller or rear roller 36 has a roller diameter 37 on which the roller 36 rolls in a circle 38 around the mounting post 30 as the latch assembly is pivoted by the latch actuator. The front roller 35 also has a roller diameter 39 that is of the same diameter as the roller diameter of the back roller 36. The roller diameter 37 of the back roller 36 is spaced on the body 31 at the same distance from the mounting post 30 as the roller diameter 39 of the front roller 35, so that the roller diameters 37,39 of the rollers 35,36 move on the same circle 38 on the back surface of the mounting ring 12.

The front roller 35 of each latch assembly 20 has a gripping periphery 40 on the outer end of the roller 35 spaced farther from the mounting post 30 than the rolling peripheries 37,39 of the rollers 36,35. The gripping periphery 40 is of smaller diameter than the rolling peripheries 37,39 and, as a result, does not contact the back surface of the mounting ring 12 when the latch body 31 is rotated by the actuators to the latched position. The gripping periphery 40 is dimensioned to contact the back side of the wafer 17 and latch the wafer 17 between the gripping periphery 40 of the front roller 35 and the annular surface 25 on the mounting ring 12, as illustrated in FIG. 3. The gripping periphery 40 of the front roller 35 is an outwardly flared conical surface that is tapered so that only the outer edge contacts the wafer 17 regardless of the thickness of the wafer 17. The inner and outer edges of the gripping periphery 40 are rounded.

A set of four detents is provided around the circles 38 on the back side of the mounting ring 12. Three of these detents, including a back detent 42 and a pair of side detents 43, are the same depth and size, and of the same spherical shape and diameter as the rolling peripheries 37,39 of the back and front rollers 36,35. The fourth detent is a front detent 44, which is of the same spherical shape and diameter as the rolling peripheries 37,39, but is of greater depth and size. As such, the rolling periphery 39 of the front roller 35 only fully seats in the front detent 44 if there is no wafer 17 on the mounting surface 25 of the mounting ring 12. If a wafer 17 is present on the surface 25, the gripping periphery 40 of the front roller 35 of the latches rolls onto the back surface of the wafer 17 and prevents the rolling periphery 39 from dropping into the detent 44 when the front roller 35 is centered on the detent 40.

When the holder 10 is used to process the back sides of wafers 17, the front side of the wafer 17, which may have partially formed devices on the side thereof, is facing a backplane 50. To prevent contact between the device side of such a wafer 17 and the backplane 50, a pair of abutting contact surfaces 47,48 is provided, as illustrated in FIG. 3. Preferably, one surface is carried on a stop 52 extending from, for either the mounting ring 12 or the backplane 50, to hold the mounting ring 12 away from the backplane 50 and allow a gap 54 to be maintained between the wafer 17 and the backplane 50.

Figure 4:
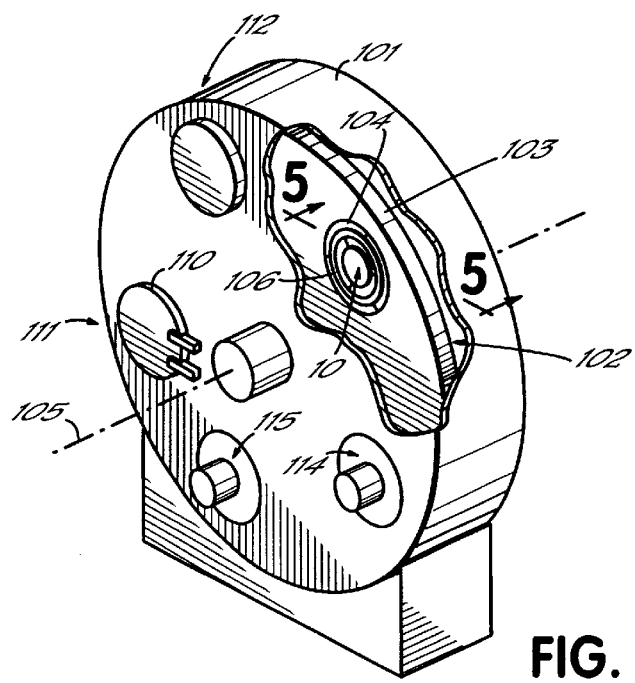
FIG. 4 is a partially broken away perspective view of a semiconductor wafer processing apparatus of a type suitable for physical vapor deposition of a multiple layered coating upon a wafer, such as a Ta-Ta-Au multiple layered backside film deposition upon a semiconductor wafer.

A processing apparatus 100 of the type referred to above is illustrated diagrammatically in FIG. 4. The apparatus 100 has a vacuum tight housing 101 which encloses a plenum chamber 102 in which rotates a circular indexing plate 103. The index plate 103 preferably has five openings 104 therein, spaced at equal 72° angular increments around a central axis 105 on which the plate 103 rotates. In each of the openings is a resiliently mounted annular support ring 107 in the center of which is mounted one of the wafer holders 10.

The housing 101 includes five stations 111–115, each also positioned at equal 72° angular intervals around the axis 105. These stations include a load lock station 111 having a load lock door 110 through which wafers 17 are loaded and unloaded into holders 10 on the plate 103 when the holder is sealed in a load lock chamber at the station 111. The stations also include four other processing chambers, one at each of the other stations 112–115, such as, for example, a sputter etch chamber 112, and three sputter coating chambers 113–115.

The chambers 113–114 may include, for example, two tantalum deposition chambers 113 and 114 and one gold deposition chamber 115. This configuration is used to deposit a gold layer on the backside of wafers 17 when loaded backside first through the loadlock 111. Such wafers 17 will also subjected in other processes to processing on the frontsides thereof to coat and etch features of semiconductor devices. The tantalum-tantalum-gold (Ta-Ta-Au) process is described herein as an example of one process which particularly benefits from the present invention. Other processes and coatings will also benefit from the present invention.

Figure 5:
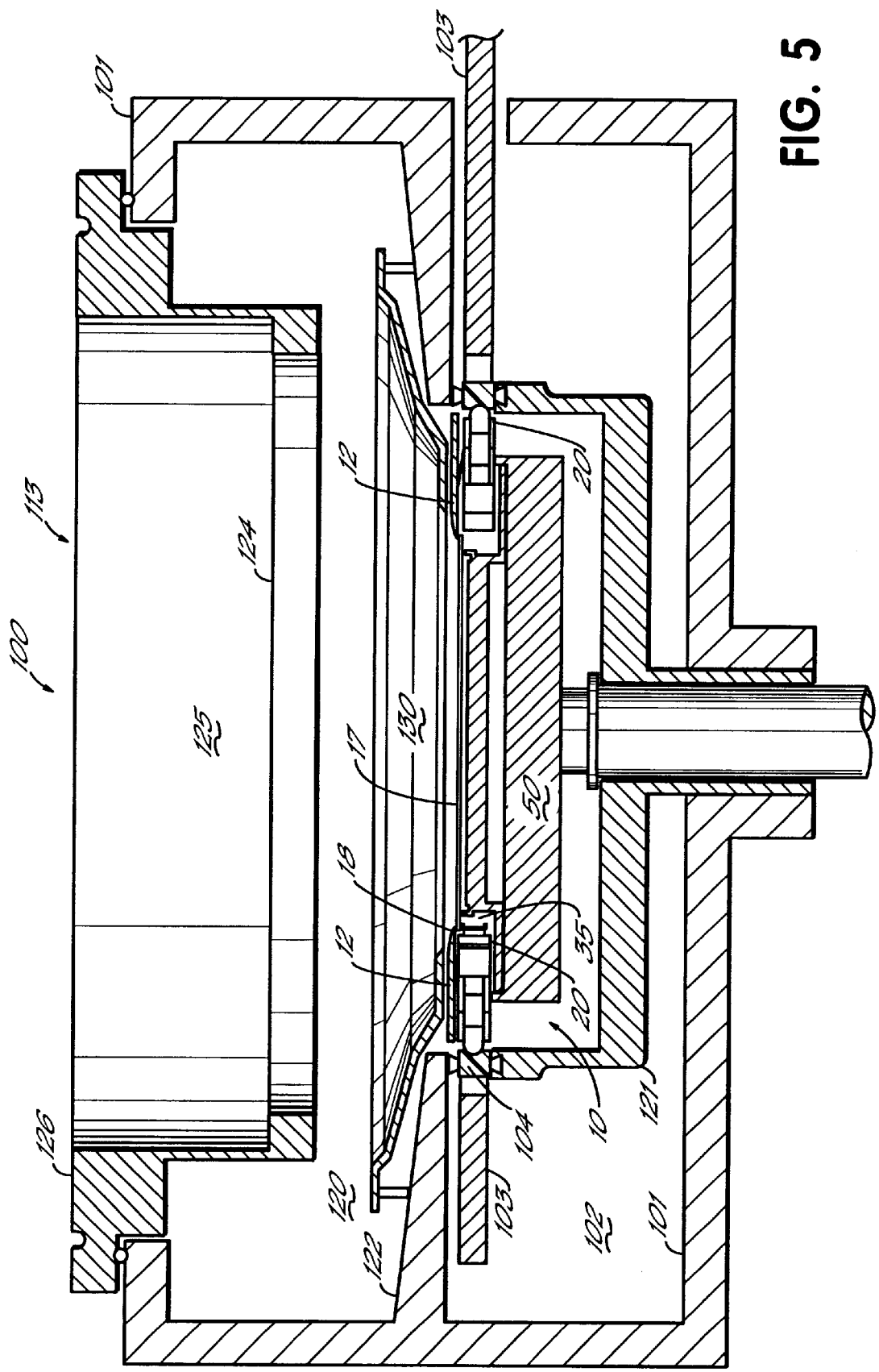
FIG. 5 is a cross-sectional diagram of a sputter coating processing chamber of a semiconductor wafer processing apparatus of FIG. 4 taken along line 5—5 of FIG. 4 employing the wafer holder of FIGS. 1–3.

The configuration of sputtering chambers 113–115 of the apparatus 100 is illustrated in FIG. 5 which shows sputter coating chamber 113 in cross-section. Chamber 113 includes a sealed processing chamber 120 formed of the plenum chamber 102 by the clamping of the annular ring 106 that is at the station 113 between a moveable chamber closure 121 and a portion 122 of the housing 101. This clamping of the ring 106 positions the holder 10 that is supported in the opening of the ring 106 to bring a wafer 17 held in the holder 10 into position for processing spaced from and parallel to a sputtering target 124 of coating material. For Ta-Ta-Au deposition, the coating material of which the target is made is tantalum. The target 124 is mounted in a cathode assembly 125 that is in turn mounted to a cathode housing 126 which seals an opening in the chamber wall 101 at the station 113. Once the wafer 17 is positioned in the chamber 113, backplane 50 is moved into position adjacent the opposite side of the wafer 17 from that being coated with sputtering material.

In the processing of the wafer 17, a plasma is generated in the vacuum of the chamber 120 and material is sputtered from the target 124 by bombardment of the target 124 with ions of gas from the plasma in the space of the chamber 120. The atoms and particles of tantalum sputtered from the target 124 move across the space of the chamber 120 and coat the wafer 17 on the holder 10. Components of the holder 10 are shielded from the deposition of sputtered coating material by a shield 130 which is attached to the housing portion 122 and surrounds the holder 10. The clamping ring 12 is, however, located on the side of the wafer 17 to be processed and faces the target 124. Part of the ring 12 is covered by the shield 130. However, the inner rim 18 of the ring 12 extends beyond the inner rim of the shield 130 and is thus vulnerable to deposition of coating material from the target 124. As each ring 12 is indexed through all of the chambers 113–115 during the depositions of a each of a large number of wafers, the cumulative thickness of coating that builds up on the inner rim of the ring 12 may be equivalent to the thicknesses of coatings deposited on hundreds, and perhaps thousands, of wafers. This coating buildup 19 on the ring 12 is illustrated as coating buildup 19 in FIG. 3.

In the processing of a wafer 17 in the apparatus 100, a wafer 17 is etched in the etch chamber 112, then coated with two depositions of tantalum, one in chamber 113 and one in chamber 114, then is coated with one deposition of gold in chamber 115, then is unloaded from the holder in the loadlock chamber 111 whereupon a new wafer 17 in loaded into the same holder 20. The cycle time required to load, process and unload a single wafer in the apparatus 100 is about five minutes, one minute in each chamber which includes about 20 seconds to index the plate 103 to move the holders 10 from chamber to chamber. During the course of this process, the retaining ring 12 is subjected to peak temperatures eventually reaching about 490° F. (254° C.).

Figure 6:
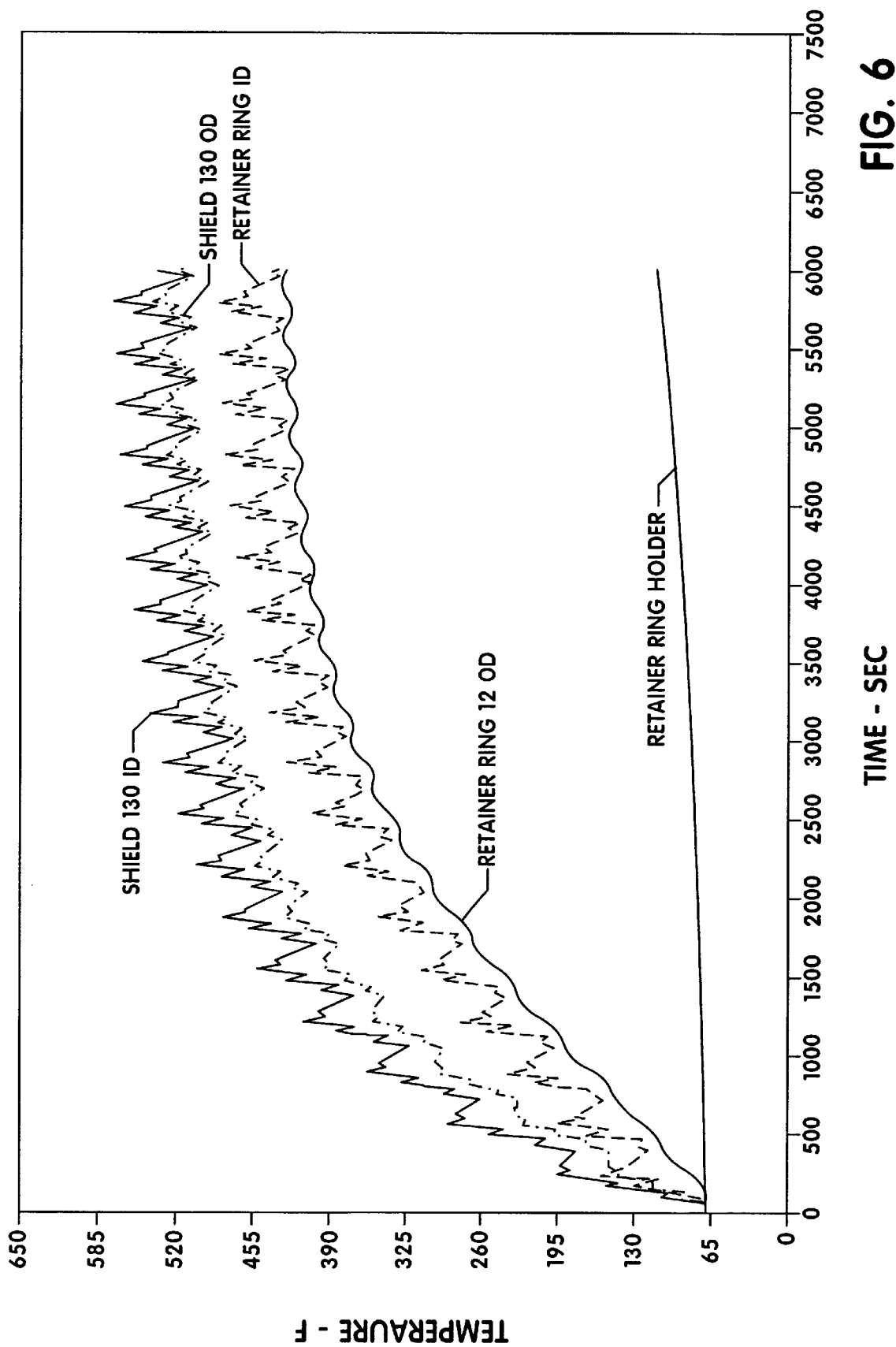
FIG. 6 is a graph illustrating component temperatures as a function of processing time.

Process temperatures of the wafers 17 vary, for example, from chamber to chamber, from 365° F. (185° C.) in the etch chamber 112 to about 527° F. (275° C.) in the gold deposition chamber 115. Many components in the chamber are water cooled to about room temperature of about 68° F. (20° C.). The annular housing 11 of the holder 10, to which the springs 13,14 that support the ring 24 connect, ranges from about 68° F. (20° C.) to about 104° F. (40° C.). The temperatures on the shield 130 and the components of the wafer holder 10 increase from minimums when the first wafer 17 is introduced into the machine 100 for processing and increase to steady state levels after about 18 wafers or more are processed. FIG. 6 graphically represents the temperatures on the inner and outer edges of the shield 130, the inner and outer edges of the clamping ring 12 and the annular housing 11 of the holder 10.

Holders 10 have been customarily formed with the housing 11 thereof made of aluminum and the clamping ring made of stainless steel, typically SS-316 stainless steel. Heat buildup occurs on chamber components such as the clamping ring 12, particularly on the deposition surfaces around the inner edge 18 of the ring 12. Heat flow from the ring 12 is limited in the vacuum of the chamber 120 to radiation and conduction at the contact surfaces through which the ring 12 is mounted to the housing 11, at the springs 13 and 14. The heating of the clamp ring 12 has been found to subject the ring 12 to sufficient thermal stresses when used in Ta-Ta-Au deposition processes to cause permanent deformation of the clamp ring 12. This deformation has been found to become excessive, rendering the ring 12 useless after the processing of a few hundred wafers, and requiring a replacement of the ring 12 with a new, clean, undeformed ring. Run through the same number of thermal cycles without subjecting the ring 12 to the Ta-Ta-Au deposition is found not to subject the ring 12 to thermal stresses that are sufficient to permanently deform the ring 12.

Figure 7:
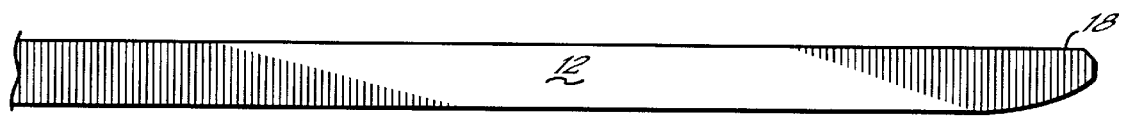
FIG. 7 is a cross-sectional view similar to FIG. 3 illustrating a clamping ring of the holder of FIGS. 1–3 in a clean condition.
Figure 7A:
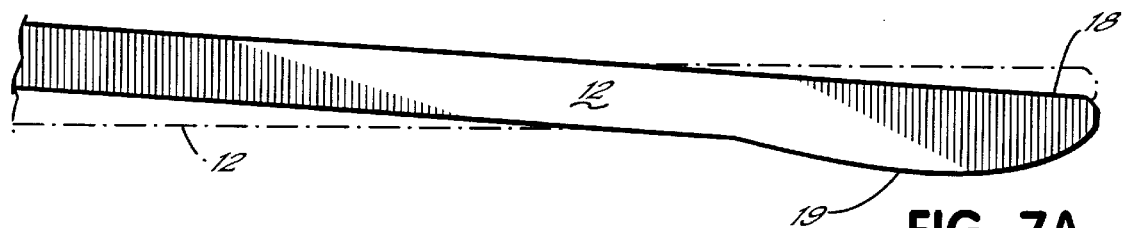
FIG. 7A is a cross-sectional view similar to FIG. 7 illustrating the condition of a clamping ring made of stainless steel following the accumulation of a film of about 0.040 inches of tantalum.

FIG. 7 illustrates the cross-section of a clean and unstressed clamp ring 12 of SS-316 stainless steel showing an essentially planar annular ring with its inner edge 18 free of deposited coating material. FIG. 7A shows the cross-section of the same ring 12 after being subjected to a number of deposition cycles that elevated to ring 12 to the steady state temperatures and deposited a layer 19 of tantalum 0.040 inches thick on the inner edge 18 of the ring 12, with the ring 12 then cooled to room temperature. It is found in tests that the inner edge 18 of the clamp ring 12 warps toward the chamber 120 by an average amount of 0.0413 inches relative to outer edge 118 of the clamp ring 12. It is concurrently found that the tantalum layer 19 is in compression while most of the clamping ring 12 is in tension.

The deformation mechanism is thought to be due at least in part to the differences in the thermal expansion coefficients between the deposited tantalum layer 19 and the SS-316 stainless steel of which the ring 12 is made. The coefficient of thermal expansion for tantalum is $3.6 \times 10^{-6}$ in/in-° F. while the coefficient of thermal expansion for SS-316 is $9.6 \times 10^{-6}$ in/in-° F. In that the tantalum deposition occurs when the temperature of the ring 12 is elevated at between 460° F. and 480° F., the layer 19 is essentially stress free as long as it is hot, but during the cooling down of the ring 12 and layer 19, the SS-316 of the ring 12 contracts much more than the tantalum layer 19, putting the layer 19 in compression. This results in the production of a circumferential force in the tantalum that produces a resultant force vector $F_c$ in the tantalum layer 19 and a resultant force vector $F_r$ in the steel ring 12 that are displaced by a moment arm L, producing a bending moment about a circumferential axis around the ring 12 that bends the inner edge 18 of the ring 12 into the chamber 120.

Figure 7B:
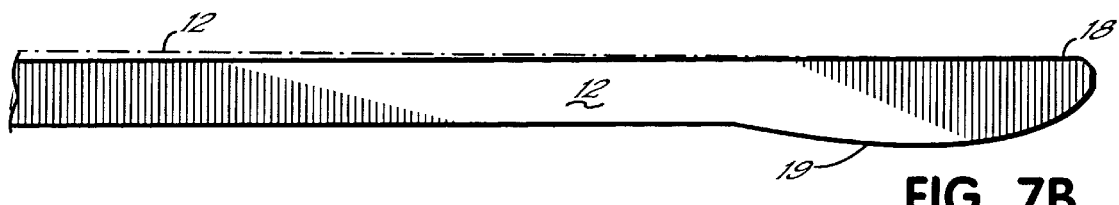
FIG. 7B is a cross-sectional view similar to FIG. 7A illustrating the condition of a clamping ring made of molybdenum following the accumulation of a film of about 0.040 inches of tantalum.

According to the principles of the present invention, the retaining ring 12 is formed of a material having a coefficient of thermal expansion that is closer to that of tantalum than is the commonly used stainless steel material. The material, which is preferably non-magnetic, may include materials such as titanium or molybdenum, with molybdenum being preferred. Titanium has a coefficient of thermal expansion of titanium is $5.0 \times 10^{-6}$ in/in-° F. and the coefficient of thermal expansion for molybdenum is $3.0 \times 10^{-6}$ in/in-° F. With the SS-316 replaced by these materials, a similar test for the warping of the ring 12 with a 0.040 inch layer 19 of tantalum produces a deflection of the inner edge of the ring 12 relative to the outer edge of 0.022 for a titanium ring and –0.005 for a molybdenum ring, compared to the 0.0413 inches for an SS-316 stainless steel ring ad described above. The deformation of the molybdenum ring 12 is illustrated in FIG. 7B.

Selection of the material of which the clamping ring 12 should be made by selecting a material having a coefficient of thermal expansion that is closer to that of the coating material than is the coeffecient of thermal expansion of alternative clamping rings that experience premature excessive warping. In addition, a material having a high coefficient of thermal conductivity is preferred. For example, the thermal conductivity of molybdenum is 84.5 Btu-ft/hr-ft$^2$-° F. while that of SS-316 is 9.4 Btu-thr-ft$^2$-° F. A high modulus of elasticity than that of the material that experiences the undesirable warping is also desirable in that the same thermal stresses will produce less deformation. For example, the modulus of elasticity of molybdenum is $47 \times 10^6$ psi while that of SS-316 is $28 \times 10^6$ psi.

it is found that with the ring of SS-316 stainless steel, deposition of a 40 mil coating under the conditions described above not only produces a permanently deformed coated ring 12 but produces a ring 12 that retains permanent deformation after the coating is cleaned from the ring. With the molybdenum clamping ring 12, removal of the tantalum coating from the ring 12 leaves a molybdenum ring that returns to its original shape. Thus, under the circumstances, the molybdenum ring does not experience thermal stresses that exceed the yield stress of the material so that the ring does not itself experience plastic deformation. Accordingly, such molybdenum ring is reusable where the stainless steel ring is not.

Those skilled in the art will appreciate that the applications of the present invention herein are varied, and that the invention is described in preferred embodiments Accordingly, additions and modifications can be made without departing from the principles of the invention.

What is claimed is:

1. A wafer holder clamping ring for use in a semiconductor processing apparatus that will resist warping and provide uniform clamping contact around the perimeter of a wafer, the clamping ring comprising:

an annular disc formed of molybdenum and having:

a substantially circular opening therein bounded by an inner wafer engaging edge, the disc having a deposition chamber side and a wafer engaging side, means for locating and mounting three pivotal latches at equal angular intervals on the wafer engaging side of the disc, said means including three latch mounting hole and detent sets spaced at equal angular intervals around the disc adjacent the inner wafer engaging edge on the wafer engaging side of the disc, each set including a latch mounting hole extending through the surface of the disc on the wafer engaging side thereof and adapted to support a latch and a plurality of latch roller receiving depressions in said surface on the wafer engaging side of the disc that are spaced equal distances from said latch mounting hole and angularly spaced approximately 90° apart and adapted to retain the latch in latched and unlatched positions, and means for facilitating the mounting of the ring so that the ring is uniformly biased around the center thereof toward the wafer engaging side thereof, said means including three coil spring attachment holes in said surface spaced at equal angular intervals around the disc and three leaf spring mounting holes in said surface spaced at equal angular intervals around the disc and each centered between adjacent ones of the coil spring attachment holes, each of said holes being adapted for the connection of the respective spring thereto.

2. The wafer holder clamping ring of 1 wherein:

the wafer engaging edge is circular about most of its circumference and includes a cord segment spanning the remainder of the circumference so that the shape conforms to the outer edge of a conventional semiconductor wafer, which outer edge has an orientation flat edge on its outer perimeter.

3. The wafer holder clamping ring of 1 wherein:

the annular disc has generally flat upper and lower surfaces.

4. The wafer holder clamping ring of claim 1 further comprising:

a layer of tantalum and a layer of gold coating an annular area on the chamber facing side of the ring adjacent the inner wafer engaging edge.

5. The wafer holder clamping ring of claim 1 further comprising:

a layer of tantalum having a thickness of 0.040 inches on an annular area on the chamber facing side of the ring adjacent the inner wafer engaging edge.

6. A wafer clamping assembly comprising the wafer holder clamping ring of claim 1 and fuirther comprising:

a set of three latches each rotatably mounted to the ring on the wafer engaging side thereof at one of the latch mounting holes so as to rotate about an axis aligned with said one of the holes and perpendicular to the ring, each latch including a plurality of rollers mounted to rotate on the latch about an axis parallel to the ring along a circular path around said one of the latch mounting holes through an arc of approximately 90° between adjacent ones of the depressions.

7. A wafer holder comprising the wafer clamping assembly of claim 6 and further comprising:

an annular wafer holder housing; and two sets of springs resiliently connecting the wafer holder housing to the ring on the wafer engaging side thereof so as to bias the ring toward the housing, the sets including a set of three coil springs linked to the ring at coil spring attachment holes and three leaf springs linked to the ring at the leaf spring mounting holes.

8. A wafer clamping assembly comprising the wafer holder clamping ring of claim 1 and further comprising:

an annular wafer holder housing; and two sets of springs resiliently connecting the wafer holder housing to the ring on the wafer engaging side thereof so as to bias the ring toward the housing, the sets including a set of three coil springs linked to the ring at coil spring attachment holes and three leaf springs linked to the ring at the leaf spring mounting holes.

9. A wafer holder clamping ring for use in a semiconductor processing apparatus to resist warping and provide unifoim clamping contact around the perimeter of a wafer when deposits accumulate on the ring, the clamping ring comprising:

an annular disc formed of molybdenum;

the disc having:

a substantially circular opening therein bounded by an inmer edge, opposite substantially parallel sides including a substantially planar deposition chamber side and a substantially planar wafer engaging side, three sets of latch mounting structures angularly spaced apart on the wafer engaging side of the disc, each set including:
- a latch mounting hole extending in the wafer engaging side of the disc adapted to pivotally support a latch therein, and
- a plurality of latch roller receiving depressions on the wafer engaging side of the disc that are approximately equidistant from the latch mounting hole of the respective set and are spaced at intervals of approximately 90° around the respective latch mounting hole of the set, the depressions being configured to retain the latch in alternative latched and unlatched positions; and a plurality of spring attachment holes including:
  - three coil spring attachment holes in the wafer engaging side of the disc and spaced at angular intervals around the disc,
  - three leaf spring attachment holes in the wafer engaging side of the disc and spaced at angular intervals around the disc, each leaf spring attachment hole being between adjacent ones of the coil spring attachment holes, and
  - each of the spring attachment holes being configured for the connection to the disc of one of a respective coil or leaf spring.

10. The wafer holder clamping ring of claim 9 further comprising:

a layer of tantalum and a layer of gold coating an annular area on the chamber facing side of the ring adjacent said inner edge.

11. The wafer holder clamping ring of claim 9 further comprising:

a layer of tantalum an annular area on the chamber facing side of the ring adjacent said inner edge.

12. The wafer holder clamping ring of claim 9 further comprising:

a layer of tantalum an annular area on the chamber facing side of the ring adjacent said inner edge, the layer of tantalum having a thickness of 0.040 inches on an annular area on the chamber facing side of the ring adjacent said inner edge.

* * * * *

UNITED STATES PATENT AND TRADEMARK OFFICE
CERTIFICATE OF CORRECTION

PATENT NO. : 6,258,228 B1
DATED : July 10, 2001
INVENTOR(S) : Reiss, Ira

It is certified that error appears in the above-identified patent and that said Letters Patent is hereby corrected as shown below:

Column 2,
Line 61, reads "continues edge" and should read -- continuous edge --.

Figure 2:
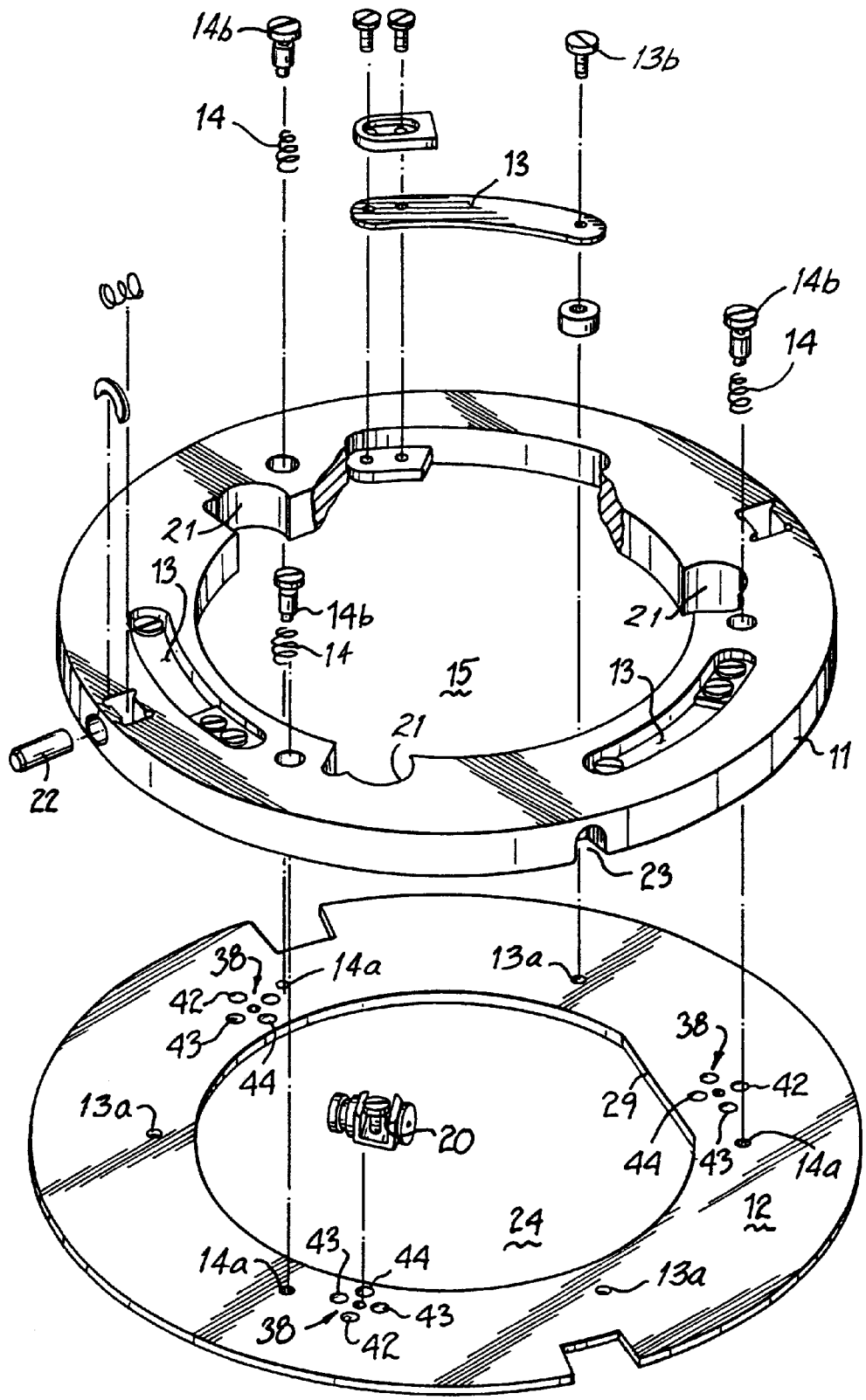
FIG. 2 is a disassembled perspective view of the wafer holder of FIG. 1.

Column 4,
Line 24, reads '"a set of three equally angularly spaced ...the leaf and coil"' and should read without quotation marks.
Line 28, reads "provide a balance mounting" and should read -- provide a balanced mounting --.
Line 29, reads "and the housing 11" and should read -- and the housing 11 as shown in Fig. 2 --.
Line 66, reads "In processing apparatus 100, the holder" should read -- In Fig. 4, the holder --.

Column 5,
Line 6, reads "spring loaded" and should read -- spring-loaded --.
Line 10, reads "to be held the holder" and should read -- to be held by the holder --.

Column 6,
Line 46, reads "support ring 107" and should read -- support ring 106 --.
Lines 51, 52 and 54, read "load lock" and should read -- loadlock --.
Line 59, reads "The chambers 113-114" and should read -- The chambers 113-115 --.
Line 64, reads "will also subjected to" and should read -- will also be subjected to --.

Column 7,
Line 38, reads "of a each of a large" and should read -- of each of a large --.
Line 49, reads "wafer 17 in loaded" and should read -- wafer 17 is loaded --.

Column 8,
Line 31, reads "elevated to ring 12" and should read -- elevated ring 12 --.
Line 33, reads "0.040 inches" and should read -- 0.040 inch --.
Line 37, reads "0.0413 inches" and should read -- 0.0413 inch --.
Line 37, reads "outer edge 118" and should read -- the outer edge --.
Lines 54 and 55, read "F. and F," and should read -- Fc and FT --.
Line 65, reads "Titanium has a coefficient of thermal expansion of titanium is" and should read -- The coefficient of thermal expansion of titanium is --.

UNITED STATES PATENT AND TRADEMARK OFFICE
CERTIFICATE OF CORRECTION

PATENT NO. : 6,258,228 B1
DATED : July 10, 2001
INVENTOR(S) : Reiss, Ira

It is certified that error appears in the above-identified patent and that said Letters Patent is hereby corrected as shown below:

Column 9,
Line 5, reads "0.0413 inches for an SS-316 stainless steel ring ad described" and should read -- 0.0413 inch for a SS-316 stainless steel ring as described --.
Line 8, reads "Selection of the material. of which the clamping ring 12 should be made by selecting a material having" and should read -- The material of which the clamping ring 12 should be made is determined by selecting a material having --.
Line 16 reads "A high modulus of" and should read -- A higher modulus of --.
Line 21 reads "it is found" and should read -- It is found --.
Line 37 reads "preferred embodiments" and should have a period at the end of embodiments to complete the sentence.

Column 10,
Line 4 reads "adiacent" and should read -- adjacent --.
Line 26 reads "0.040 inches" and should read -- 0.040 inch --.
Line 30 reads "fuirther" and should read -- further --
Line 61 reads "unifoim" and should read -- uniform --.
Line 67 reads "inmer" and should read -- inner --.

Column 12,
Line 14 reads "tantalum an annular area" should read -- tantalum on an annular area --.
Line 18 reads "tantalum an annular area" should read -- tantalum on an annular area --.
Line 21 reads "0.040 inches" and should read -- 0.040 inch --.

Signed and Sealed this

Twenty-fourth Day of September, 2002

Attest:

JAMES E. ROGAN
Attesting Officer          Director of the United States Patent and Trademark Office

UNITED STATES PATENT AND TRADEMARK OFFICE
CERTIFICATE OF CORRECTION

PATENT NO. : 6,258,228 B1
DATED : July 10, 2001
INVENTOR(S) : Reiss, Ira

It is certified that error appears in the above-identified patent and that said Letters Patent is hereby corrected as shown below:

Column 2,
Line 61, reads "continues edge" and should read -- continuous edge --.

Column 4,
Line 24, reads '"a set of three equally angularly spaced ...the leaf and coil"' and should read without quotation marks.
Line 28, reads "provide a balance mounting" and should read -- provide a balanced mounting --.
Line 29, reads "and the housing 11" and should read -- and the housing 11 as shown in Fig. 2 --.
Line 66, reads "In processing apparatus 100, the holder" should read -- In Fig. 4, the holder --.

Column 5,
Line 6, reads "spring loaded" and should read -- spring-loaded --.
Line 10, reads "to be held the holder" and should read -- to be held by the holder --.

Column 6,
Line 46, reads "support ring 107" and should read -- support ring 106 --.
Lines 51, 52 and 54, read "load lock" and should read -- loadlock --.
Line 59, reads "The chambers 113-114" and should read -- The chambers 113-115 --.
Line 64, reads "will also subjected to" and should read -- will also be subjected to --.

Column 7,
Line 38, reads "of a each of a large" and should read -- of each of a large --.
Line 49, reads "wafer 17 in loaded" and should read -- wafer 17 is loaded --.

Column 8,
Line 31, reads "elevated to ring 12" and should read -- elevated ring 12 --.
Line 33, reads "0.040 inches" and should read -- 0.040 inch --.
Line 37, reads "0.0413 inches" and should read -- 0.0413 inch --.
Line 37, reads "outer edge 118" and should read -- the outer edge --.
Lines 54 and 55, read "F. and F," and should read -- Fc and FT --.
Line 65, reads "Titanium has a coefficient of thermal expansion of titanium is" and should read -- The coefficient of thermal expansion of titanium is --.

UNITED STATES PATENT AND TRADEMARK OFFICE
CERTIFICATE OF CORRECTION

PATENT NO.    : 6,258,228 B1
DATED         : July 10, 2001
INVENTOR(S)   : Reiss, Ira It is certified that error appears in the above-identified patent and that said Letters Patent is hereby corrected as shown below:

Column 9,
Line 5, reads "0.0413 inches for an SS-316 stainless steel ring ad described" and should read -- 0.0413 inch for a SS-316 stainless steel ring as described --.
Line 8, reads "Selection of the material. of which the clamping ring 12 should be made by selecting a material having" and should read -- The material of which the clamping ring 12 should be made is determined by selecting a material having --.
Line 16, reads "A high modulus of" and should read -- A higher modulus of --.
Line 16, "Btu-thr-ft$^2$ -°F" should read -- Btu - ft/hr - ft$^2$ - °F --
Line 21, reads "it is found" and should read -- It is found --.
Line 37, reads "preferred embodiments" and should have a period at the end of embodiments to complete the sentence.

Column 10,
Line 4, reads "adiacent" and should read -- adjacent --.
Line 26, reads "0.040 inches" and should read -- 0.040 inch --.
Line 30, reads "fuirther" and should read -- further --
Line 61, reads "unifoim" and should read -- uniform --.
Line 67, reads "inmer" and should read -- inner --.

Column 12,
Line 14, reads "tantalum an annular area" should read -- tantalum on an annular area --.
Line 18, reads "tantalum an annular area" should read -- tantalum on an annular area --.
Line 21, reads "0.040 inches" and should read -- 0.040 inch --.

This certificate supersedes Certificate of Correction issued September 24, 2002.

Signed and Sealed this

Fifteenth Day of April, 2003

JAMES E. ROGAN
*Director of the United States Patent and Trademark Office*